(12) United States Patent
Jung

(10) Patent No.: US 6,809,983 B2
(45) Date of Patent: Oct. 26, 2004

(54) CLOCK GENERATOR FOR PSEUDO DUAL PORT MEMORY

(75) Inventor: Chang Ho Jung, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/397,483

(22) Filed: Mar. 25, 2003

(65) Prior Publication Data

US 2004/0190364 A1 Sep. 30, 2004

(51) Int. Cl.$^7$ ................................. G11C 8/00
(52) U.S. Cl. ..................... 365/230.05; 365/189.04
(58) Field of Search ................. 365/230.05, 189.04, 365/221, 194, 189.08

(56) References Cited

U.S. PATENT DOCUMENTS 5,375,089 A * 12/1994 Lo ........................ 365/189.04
6,166,963 A * 12/2000 Wen ....................... 365/189.04
6,430,088 B1 * 8/2002 Plants et al. ............ 365/189.04
6,590,826 B1 * 7/2003 Sawyer ................... 365/230.03

* cited by examiner

Primary Examiner—Anh Phung
(74) Attorney, Agent, or Firm—Suiter West PC LLO

(57) ABSTRACT

A clock generating circuit for a pseudo dual port memory incorporates feedback, delays, and latches to ensure that the write (read) operation clock pulse is sufficiently spaced in time from the read (write) operation clock. The clock generating circuit receives an external clock, a read enable signal, a write enable signal, and a reset signal as inputs. Advantages include minimization of the clock cycle time and operation unaffected by the duty ratio of an external clock. Delay circuitry may be added such that the generated clock signal has sufficient fan out and is sufficiently stable.

20 Claims, 4 Drawing Sheets

CLOCK GENERATOR FOR PSEUDO DUAL PORT MEMORY

FIELD OF THE INVENTION

The present invention generally relates to the field of memory timing, and particularly to a circuit and method for generating clock signals for a pseudo dual port memory.

BACKGROUND OF THE INVENTION

Dual or multi port memory is usually much lower density than single port memory because of the core cell structure. To increase the dual (multi) port memory density, pseudo dual port memory can be used. Although the external operation of pseudo dual port memory resembles the operation of true dual port memory, pseudo dual port memory incorporates a single port core cell. Pseudo dual port memory should perform multiple read and/or write operations within a single clock cycle. The timing is achieved through the use of one clock.

The dual port memory timing circuit of FIG. 4 works well at slower clock speeds, but is insufficient for higher clock soon to be achieved for input/output data transfers to a pseudo dual port memory. The clock signal is delayed for both read and write operations to allow sufficient set up and hold times for data. The rising edge of CLK generates the first ICLK for A port operation with ENA through Q1 and Q2. The falling edge of CLK generates the next ICLK for B port operation with ENB through Q3 and Q4. The read operation usually occurs by the first ICLK and the write operation usually occurs by the next ICLK. These ICLKs depends on the ENA and ENB status.

Pseudo dual port memory needs two operations—read and write operations—in one clock cycle. If the clock rising edge and falling edge are used to initiate these two operations, a first consideration is clock cycle time. Clock cycle time is set to at least twice the length of the longer cycle time in each port. The second consideration is clock duty ratio. If the clock falling edge is used for the other operation, the clock duty ratio should be included in the longer cycle time. The clock duty ratio effectively acts as a bottleneck for the higher cycle time operation.

Therefore, it would be desirable to provide a circuit and method to synchronize the write and read clock signals for a pseudo dual port memory.

SUMMARY OF THE INVENTION

Accordingly, the present invention is directed to a circuit and method for preventing signal degradation for a clock signal supplied to a pseudo dual port memory.

In a first aspect of the present invention, a circuit for improving timing signal integrity for a pseudo dual port memory includes a first circuit for generating a first pulse of a first timing signal and a second circuit for receiving the first timing signal as an input to generate a second pulse from the first timing signal.

In a second aspect of the present invention, a method is disclosed for providing a clock signal to a pseudo dual port memory. In the method, a first signal is received that has a periodicity, the first signal having a clock rising edge, a high logic level, a clock falling edge, and a low logic level. A second received signal controls data transfer operations. The second signal has a pulse that activates a circuit for providing a clock signal to a dual port memory. A read clock signal is generated for a first port. The read clock signal is used to generate a write clock signal for a second port. Alternatively, the first and second port may be combined into a pseudo dual port.

Several advantages are provided by the present invention. An advantage is that the port B (write) clock ICLKB is not related to CLK falling edge. The port B clock ICLKB is generated after A (read) port operation by the RESET signal that is generated by a timing block (e.g. a self time block) or some other control block. The port B clock ICLKB will make B port (write) operation start just after A (read) port operation regardless of CLK falling edge. Other advantages include minimization of the clock cycle time and operation unaffected by the duty ratio of an external clock. The port B address and input data can be latched with sufficient set up and hold times by using ICLKB as a feedback control and the delaying effect of other circuit elements.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

The present invention is directed to a circuit and method for preventing timing signal degradation for a pseudo dual port memory port. Through a system of delay and latch circuitry, the present invention permits a read operation to be performed and terminated before a write operation is performed. Adjustability may be achieved through such techniques as adjusting the number of delay elements. Timing feedback is provided to ensure that the write signal is temporally separated from the read signal.

Figure 1:
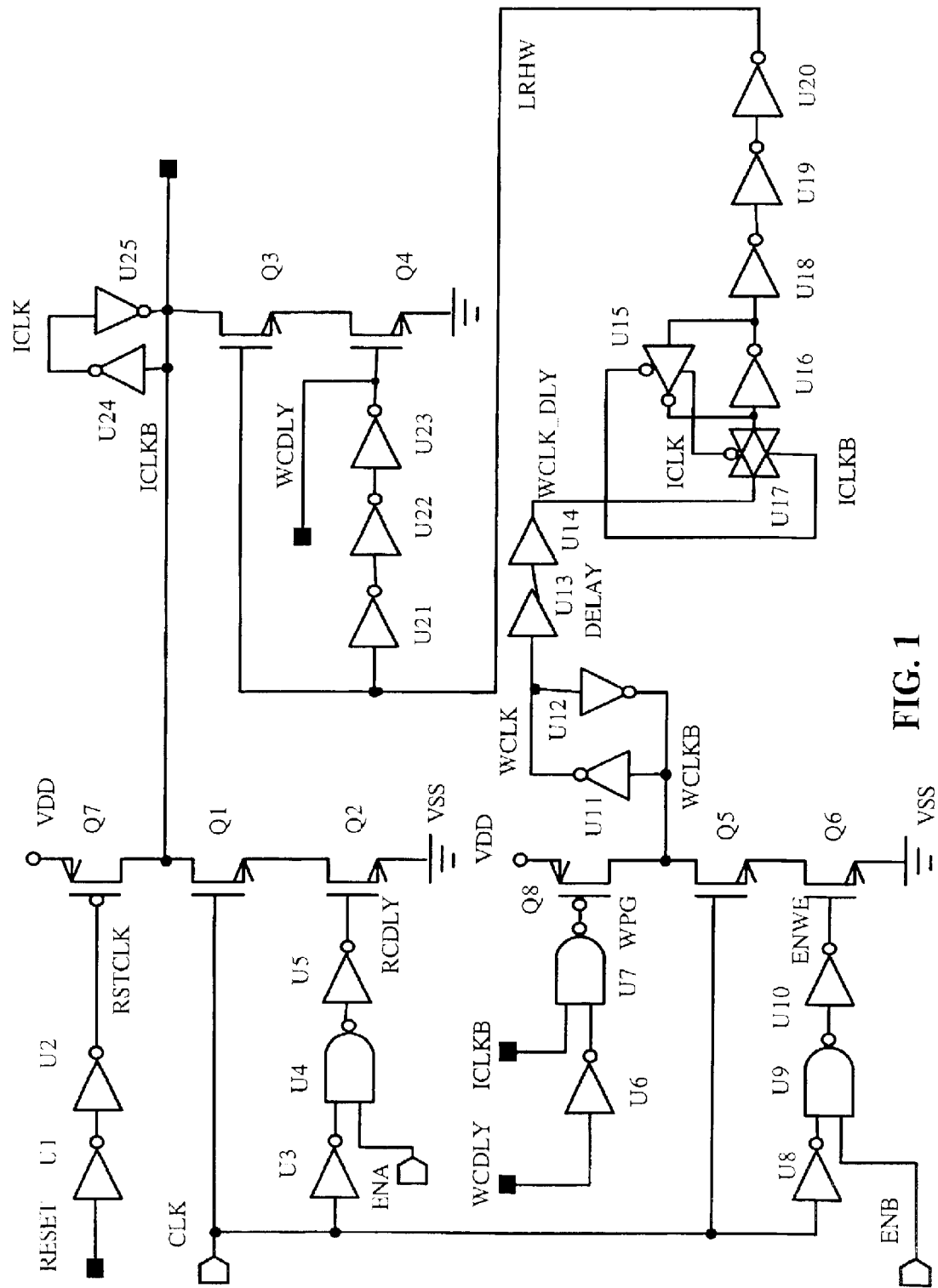
FIG. 1 illustrates a first embodiment of a clock generator circuit of the present invention for a pseudo dual port memory.

FIG. 1 shows an embodiment of a clock generator circuit for a dual port memory of the present invention. The basic inputs to the circuit include a reset signal, a clock signal CLK, a read enable signal ENA, and a write enable signal ENB. The basic outputs of the circuit are one or two clock signals ICLKB/ICLK or CCLKB/CCLK. Features of the present invention, as embodied by FIG. 1, include a read/write toggle signal LRHW in which a low logic state corresponds to a read operation and a high logic state corresponds to a write operation. The low logic state may also indicate a non-operational state or simply a non-write state. Another feature of the present invention is the use of an inverted and delayed read/write toggle signal LRHW and the clock output ICLKB as feedback to determine when a write operation is to occur. A further feature of the present invention includes a latch and transmission gate arrangement that latches read/write state bit. This arrangement provides for more stable circuit operation.

The read (i.e., port A) operation is controlled by the circuitry of the upper right quadrant of FIG. 1: logic U1–U5 and switches Q7, Q1, and Q2. From FIG. 1, the output clock signal ICLKB/ICLK is set to respective high and low logic levels by the reset signal RESET before the input clock CLK goes high. The output clock signal ICLKB for port A becomes a logic low upon the rising edge of the external input clock CLK with the read enable signal ENA at a logic high level. When the input clock signal CLK toggles to a high logic level with the read enable signal ENA at a logic high level, the two serial switches Q1 and Q2 are turned on. Preferably, the serial switches Q1 and Q2 are NMOS transistors. The output clock signal ICLKB falls to a logic low level until the reset signal RESET goes to a low logic level. This RESET low is determined through the self time delay circuit which is delayed by the physical bit line propagation delay, and returns to a high logic level by the ICLK low logic level. Both switches Q1 and Q2 are turned on from the transition of the input clock CLK to a logic high level until the input clock CLK propagates through the three delay gates U3, U4, U5 to cause the delayed read control signal RCDLY to become a logic low level. In other variations, a different number of delay gates may be used so long as the total number of delay gates is an odd number. This output clock signal ICLKB is latched by the cross coupled inverters U24, U25 to ensure that the logic level of the output clock signal ICLKB is maintained even when all switches Q1, Q2, and Q7 are turned off. The cross coupled inverters U24, U25 may be constructed as CMOS transistors. The inverters U24, U25 are designed such that the effect of the output of inverter U25 is dominated by either switch Q7 or switches Q1 and Q2 when those switches are turned on. This latched output clock signal ICLK returns to a high logic level when the reset signal RESET is generated by the reset signal generator and/or some other control logic circuitry. The RESET signal may be software driven. The RESET signal is delayed by two inverters U1 and U2 to provide control signal RSTCLK for switch Q7. The A port is usually used to read port memory because this port provides better access time performance.

The write (i.e., port B) operation is determined from feedback from the clock signal ICLKB. In the preferred timing sequence, the next ICLKB signal is generated by the read/write toggle signal LRHW toggled to high. Before the input clock signal CLK transitions to a high logic level, the write signal WCLKB is set to a high logic level by the switch Q8 when write enable gate signal WPG is at a low logic level. The write enable gate signal WPG is formed by the NANDing of the output clock signal ICLKB with delayed write control signal WCDLY that controls switch Q4 to determine the correct timing for WCLKB. Accordingly, the delayed write control signal WCLK_DLY transitions to a logic low level as the output clock signals ICLKB/ICLK are toggled to the signals' respective high and low logic levels. The read/write toggle signal LRHW (low level read, high level write) also is driven to a low logic level. The B port (write port) operation occurs while the LRHW read/write toggle signal is set at a high logic level. If write enable ENB is set to a logic high level when the input clock CLK is at a logic high level, the write signal WCLKB transitions to logic low level through switches Q5 and Q6. Switches Q5 and Q6 are preferably NMOS transistors. The switch Q6 is effectively controlled by clock signal CLK through delay gates U8, U9, U10 when the enable signal ENB is at a high logic level. The delayed write clock signal WCLK_DLY remains at a latched low logic level while the first output clock signal ICLKB/ICLK is toggled to a low/high logic level. The delayed write clock signal WCLK_DLY is toggled to a high logic level by the delay circuit from latched write clock signal WCLK after the output clock signal ICLKB/ICLK transitions to a low/high logic level. After the read operation terminates, output clock signal ICKLB/ICLK is toggled to the respective high/low logic levels by the RESET signal and the high logic level of the delayed write control signal WCLK_DLY is latched and transferred through latch and delay circuitry to provide a high logic level for the read/write toggle signal LRHW. By toggling the read/write toggle signal LRHW to a high logic level, the switches Q3 and Q4 are turned on during the time from the transition of the read/write toggle signal LRHW to a logic high level to the time for the derivative delayed write control signal WCDLY to transition to a low logic level. In the present invention, the delayed WCLK_DLY does not need to be latched high by the first ICLK/ICLKB clock. The output clock ICLKB for port B is generated and latched in a manner similar as for port A operation.

In the present example, the circuitry for the write operation is implemented through a variety of components. The write signal WCLKB is latched by cross coupled inverters U11, U12. Other latching circuitry is contemplated by the present invention. Delay circuitry U13, U14 creates signal WCLK_DLY. A transmission gate U17 allows transmission of the signal WCLK_DLY according to the polarities of clock signals ICLK and ICLKB. The transmission gate may be formed of a PMOS and an NMOS transistor in series such that the source terminal of the PMOS transistor is electrically connected to the drain (or source) terminal of the NMOS transistor. The transmission gate alternatively may be formed on a single PMOS transistor, a single NMOS transistor, or another element or combination of elements. A latch effectuated by the output clock signals ICLK and ICLKB is provided by cross coupled inverters U15 and U16. Even when inverter U15 is disabled, the other inverter U16 continues to provide either a logic high or logic low level output. This latch may be implemented by other circuitry. The value of the inverted WCLK_DLY signal is then inverted by inverters U18, U19, U20 to form the read/write toggle signal LRHW. Although three inverters have been used in the present example, a different odd number of inverters, such as one or five, may be used in other variations. The inverted WCLK_DLY signal when set to the high logic level causes the generation of a low logic level signal for clock signal ICLKB. If clock signal ICLKB is at a low logic level, then the clock signal ICLKB remains at the low logic level. If clock signal ICLKB is at a high logic level, then the clock signal ICLKB is driven to a low logic level during the period to time set by the rising edge of the read/write toggle signal LRHW and the propagation delay of inverters U21, U22, and U23. The number of inverters in series may be adjusted to three, five, or another odd number. Whereas, VSS is shown as a ground symbol, VSS may alternatively be a negative power supply voltage. The VDD voltage may be a positive voltage as measured from ground.

Figure 2:
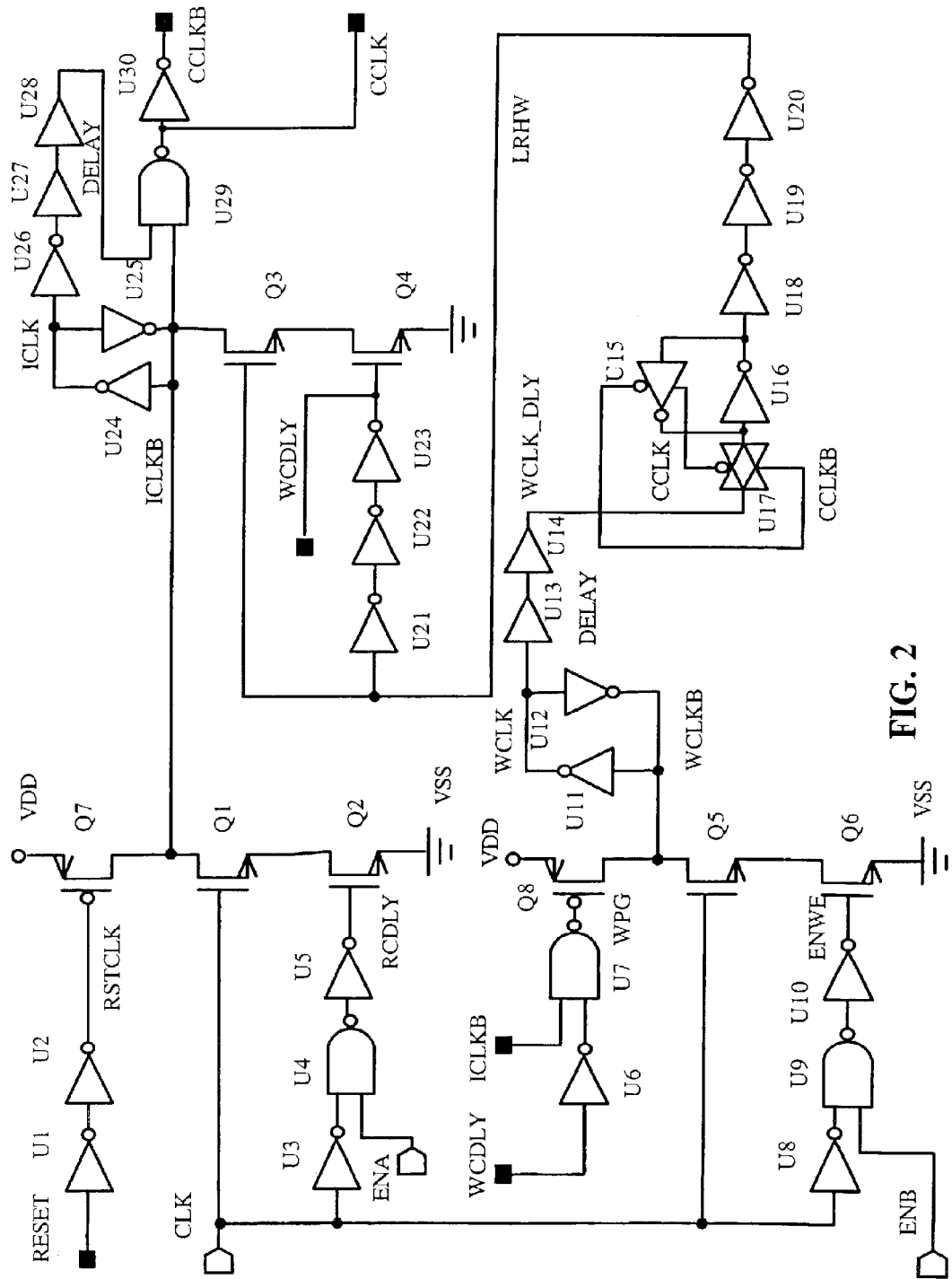
FIG. 2 illustrates a second embodiment of a clock generator circuit of the present invention for a pseudo dual port memory.

FIG. 2 represents a second embodiment of the present invention in which additional delay circuitry is provided to buffer the output clock signal CCLKB/CCLK. This additional delay circuitry helps to match the timing and to increase fan out for the clock signal CCLKB/CCLK. An additional feature of the second embodiment includes the use of the delayed clock signals CCLKB/CCLK instead of the non-delayed clock signals ICLKB/ICLK to latch the delayed write clock signal WCLK_DLY. In a variation of the embodiment of FIG. 2, the non-delayed clock signals ICLKB/ICLK may be used.

Figure 3:
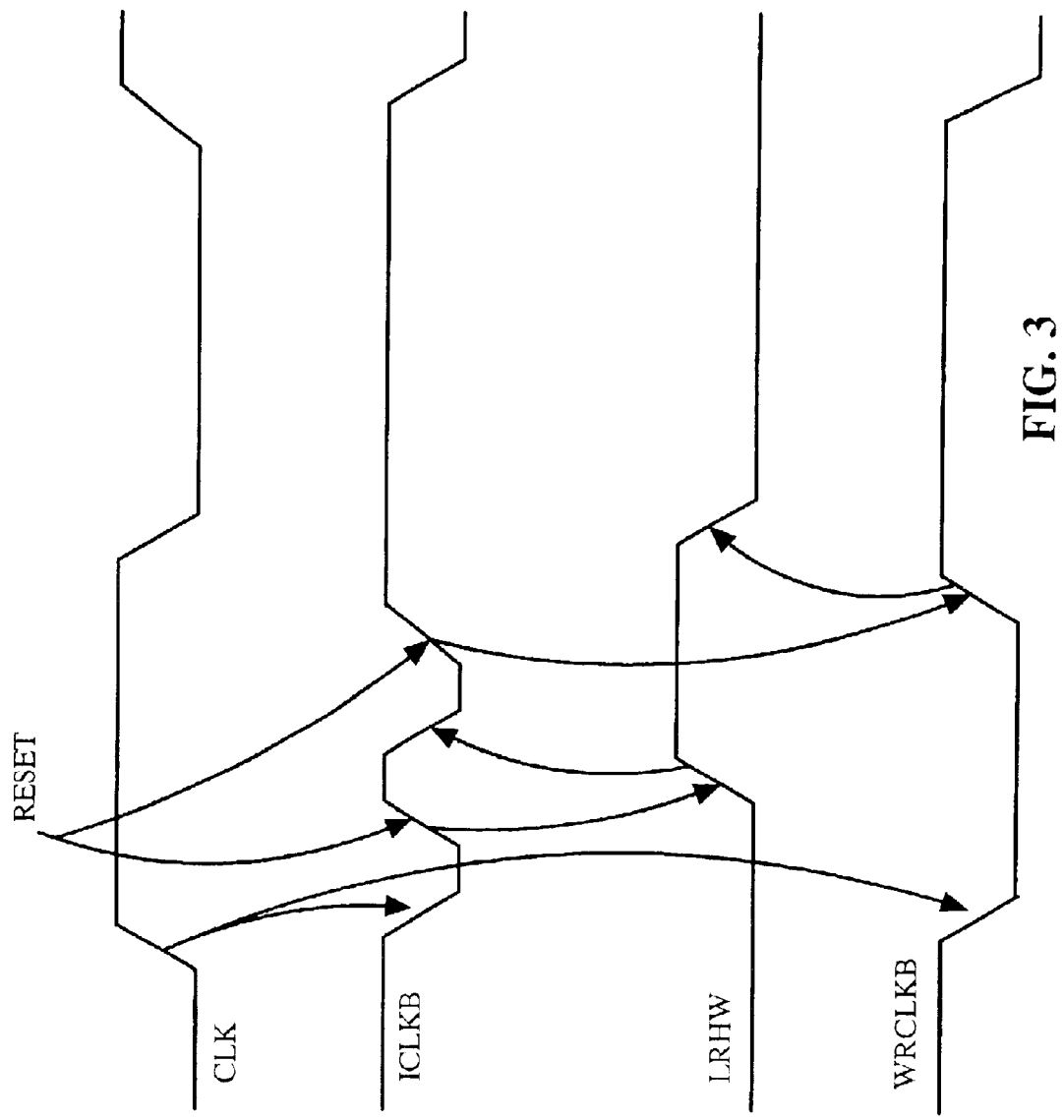
FIG. 3 illustrates a timing diagram for the circuit of FIG. 1.
Figure 4:
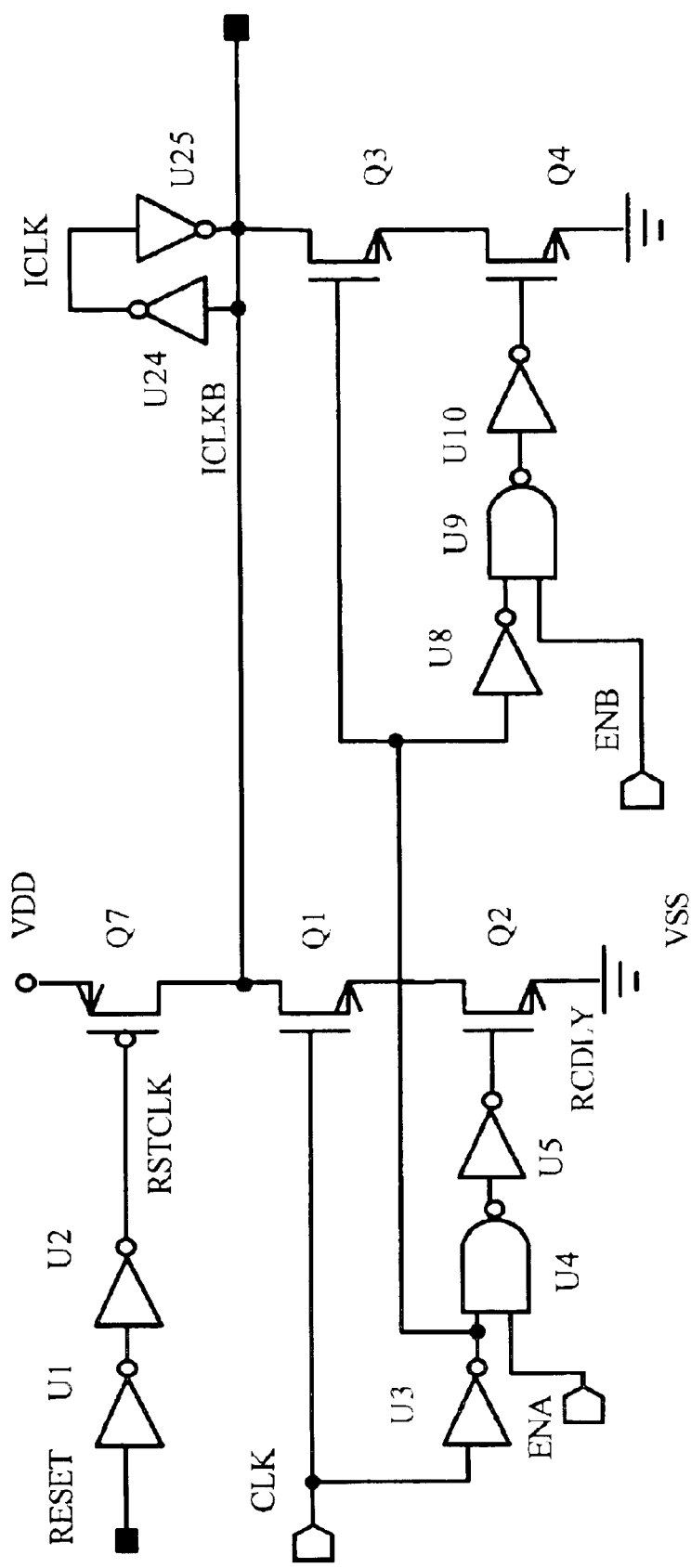
FIG. 4 illustrates a simplified clock generator circuit.

FIG. 3 represents a timing diagram for the circuit of the first embodiment that was shown in FIG. 1. The timing diagram shows the generation of clock signal ICLKB and two other signals while both read enable ENA and write enable ENB are logic high signifying enablement for read and write operations. On the rising edge of input clock signal CLK, the output signal ICLKB falls from a high logic state to a low logic state. Simultaneously, the signal WCLKB undergoes the same drop to a low logic state. WCLKB is usually used for write address latching and input data latching. Therefore, WCLKB low status is extended up to whole low status of ICLKB. This ICLKB clock for port B is not related to CLK falling edge, but depends on the read port timing. A reset signal which is delayed from the self timed circuit causes the output clock signal ICLKB to rise. The high level of input clock signal CLK causes switches Q1, Q2, Q5, and Q6 to turn on. The high logic level of the output clock signal ICLKB and the high logic level of the signal WCDLY (i.e., a delayed value of WCLKB) have no effect on the signal WCLKB as switch Q8 is turned off. The reset signal RESET remains at a logic high level so switch Q7 is turned off. Because of these conditions, output clock signal ICLKB and signal WCLKB fall to low logic levels. The reset signal RESET is pulse low such that output clock signal ICLKB switches to a logic high state. Even though switch Q2 is shortly turned off after the rising edge of the input clock CLK because of the delay effect of the odd number of inverters, the high logic state is maintained for a sufficient length of time to permit the output clock signal ICLKB to fall after the first reset pulse terminates and rise in response to the generation of a second reset pulse RESET. The high logic value of the output clock signal ICLKB causes switch Q8 to turn on, resulting in a logic high value for WCLKB which is passed on as a logic high value for read/write toggle line LRHW after a delay through gates U16, U18, U19, and U20. The generation of the second reset pulse causes output clock ICLKB to attain a logic high value that turns switch Q8 and sets WCLKB to a high logic value.

It is believed that the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages, the form hereinbefore described being merely an explanatory embodiment thereof. It is the intention of the following claims to encompass and include such changes.

What is claimed is:

1. A method for providing a clock signal to a dual port memory, comprising:

receiving a first signal that has a periodicity, the first signal having a rising edge, a high logic level, a falling edge, and a low logic level;

receiving a second signal that controls data transfer operations, the second signal having a pulse that activates a circuit for providing a clock signal to a dual port memory;

generating a read clock signal for a first port; and using the generated read clock signal to a write clock signal for a second port.

2. The method of claim 1, wherein the second signal is used alternately to provide the read clock signal or the write clock signal.

3. The method of claim 2, wherein the first port and the second port are a dual port.

4. The method of claim 2, wherein the first port and the second port are a pseudo dual port.

5. The method of claim 1, further comprising an intermediate signal having a first edge and a second edge.

6. The method of claim 5, wherein the first edge is generated by the first signal.

7. The method of claim 6, wherein the second edge is generated in response to the first signal.

8. The method of claim 7, wherein the second edge is generated by the clock signal.

9. The method of claim 5, wherein the intermediate signal is latched.

10. The method of claim 9, wherein the intermediate signal is transmitted through a transmission gate before being latched.

11. The method of claim 10, wherein the transmission gate is formed by an NMOS transistor in parallel with a PMOS transistor such that the drains of the NMOS and PMOS transistors are electrically connected and the sources of the NMOS and PMOS transistors are electrically connected.

12. The method of claim 9, wherein the intermediate signal is latched by a pair of cross coupled inverters.

13. A circuit for providing a clock signal to a dual port memory, comprising:

means for receiving a first signal that has a periodicity, the first signal having a rising edge, a high logic level, a falling edge, and a low logic level;

means for receiving a second signal that controls data transfer operations, the second signal having a pulse that activates a circuit for providing a clock signal to a dual port memory;

means for generating a read clock signal for a first port; and means for using the generated read clock signal to a write clock signal for a second port.

14. The circuit of claim 13, wherein the second signal is used alternately to provide the read clock signal or the write clock signal.

15. The circuit of claim 14, wherein the first port and the second port are a dual port.

16. The circuit of claim 14, wherein the first port and the second port are a pseudo dual port.

17. The circuit of claim 13, further comprising an intermediate signal having a first edge and a second edge.

18. The circuit of claim 17, wherein the first edge is generated by the first signal.

19. The circuit of claim 18, wherein the second edge is generated in response to the second signal.

20. The circuit of claim 19, wherein the second edge is generated by the clock signal.

* * * * *